(12) United States Patent
Wiatr et al.

(10) Patent No.: US 7,923,338 B2
(45) Date of Patent: Apr. 12, 2011

(54) INCREASING STRESS TRANSFER EFFICIENCY IN A TRANSISTOR BY REDUCING SPACER WIDTH DURING THE DRAIN/SOURCE IMPLANTATION SEQUENCE

(75) Inventors: Maciej Wiatr, Dresden (DE); Roman Boschke, Dresden (DE); Anthony Mowry, Buda, TX (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/271,162

(22) Filed: Nov. 14, 2008

(65) Prior Publication Data

US 2009/0246927 A1 Oct. 1, 2009

(30) Foreign Application Priority Data

Mar. 31, 2008 (DE) .................. 10 2008 016 512

(51) Int. Cl.
*H01L 21/336* (2006.01)
(52) U.S. Cl. ................. 438/305; 438/299; 257/E21.632
(58) Field of Classification Search .................. 438/197, 438/299, 301, 303, 305, 306
See application file for complete search history.

(56) References Cited

U.S. PATENT DOCUMENTS

| | | | |
|---|---|---|---|
| 6,180,472 B1 * | 1/2001 | Akamatsu et al. | 438/303 |
| 6,770,540 B2 * | 8/2004 | Ko | 438/303 |
| 7,012,028 B2 | 3/2006 | Bu et al. | 438/733 |
| 2002/0192868 A1 * | 12/2002 | Kim | 438/112 |
| 2005/0266639 A1 * | 12/2005 | Frohberg et al. | 438/257 |
| 2006/0246641 A1 * | 11/2006 | Kammler et al. | 438/184 |
| 2007/0202653 A1 * | 8/2007 | Hoentschel et al. | 438/301 |

OTHER PUBLICATIONS

"Homogeneous" & "Homogeous", Merriam-Webster Online Dictionary. https://www.merriam-webster.com/dictionary/homogenous. Last Accessed Sep. 24, 2010.*
Translation of Official Communication from German Patent Office for German Patent Application No. 10 2008 016 512.3 dated Oct. 21, 2008.

\* cited by examiner

*Primary Examiner* — Charles Garber
*Assistant Examiner* — Reema Patel
(74) *Attorney, Agent, or Firm* — Williams, Morgan & Amerson, P.C.

(57) ABSTRACT

By forming a single spacer element and reducing the size thereof by a well-controllable etch process, a complex lateral dopant profile may be obtained at reduced process complexity compared to conventional triple spacer approaches in forming drain and source regions of advanced MOS transistors.

24 Claims, 6 Drawing Sheets

INCREASING STRESS TRANSFER EFFICIENCY IN A TRANSISTOR BY REDUCING SPACER WIDTH DURING THE DRAIN/SOURCE IMPLANTATION SEQUENCE

BACKGROUND

1. Field of the Disclosure

Generally, the subject matter disclosed herein relates to the field of integrated circuits, and, more particularly, to the formation of transistors having strained channel regions caused by stressed overlayers, wherein material of spacer elements is partially removed to enhance performance of highly scaled field effect transistors.

2. Description of the Related Art

Modern integrated circuits include a large number of circuit elements, which are formed in a complex manufacturing sequence that may include several hundred process steps, each of which is to be performed under well-controlled conditions in order to meet the required device specification. On the other hand, successful marketing of the semiconductor devices crucially depends on the overall production costs, which are determined by throughput and yield of the overall manufacturing flow. Thus, avoiding one or more of the many complex process steps without negatively affecting the final device performance or enhancing the device performance without significantly contributing additional complexity to the overall process flow are important criteria for semiconductor manufacturers.

Currently, a plurality of process technologies are practiced, wherein, for complex circuitry, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with a weakly or inversely doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region is one important factor that determines performance of MOS transistors. Thus, the reduction of the channel length, and associated therewith the reduction of the channel resistivity per unit width, is a dominant design criterion for accomplishing an increase in the operating speed of the integrated circuits, while also allowing an increased packing density, thereby providing the potential for realizing enhanced device functionality for a given available chip area.

The reduction of the transistor dimensions, however, entails a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for every new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control. Hence, reducing the channel length also requires reducing the depth of a portion of the drain and source regions, so-called drain/source extension regions, with respect to the interface formed by the gate insulation layer and the channel region, thereby requiring sophisticated implantation techniques. For this reason, sophisticated spacer techniques are necessary to create the highly complex dopant profile and to serve as a mask in forming metal silicide regions in the gate electrode and the drain and source regions in a self-aligned fashion.

Since the continuous size reduction of the critical dimensions, i.e., the gate length of the transistors, necessitates the adaptation and possibly the new development of process techniques concerning the above-identified process steps, it has been proposed to enhance device performance of the transistor elements by increasing the charge carrier mobility in the channel region for a given channel length. One efficient approach in this respect is the modification of the lattice structure in the channel region, for instance by creating tensile or compressive strain, which results in a modified mobility for electrons and holes. For example, creating tensile strain in the channel region formed in a silicon region having a standard crystallographic orientation, i.e., the surface is a (100) equivalent plane and the channel length is oriented along a <110> equivalent axis, increases the mobility of electrons, which in turn directly translates into a corresponding increase in the conductivity and thus transistor performance. On the other hand, compressive stress in the channel region may increase the mobility of holes, thereby providing the potential for enhancing the performance of P-type transistors. Consequently, it has been proposed to introduce, for instance, a silicon/germanium layer or a silicon/carbon layer in or below the channel region to create tensile or compressive stress. Although the transistor performance may be considerably enhanced by the introduction of stress-creating layers in or below the channel region, significant efforts have to be made to implement the sequence for forming corresponding stress layers into the conventional and well-approved CMOS technique. For instance, additional epitaxial growth techniques have to be developed and implemented into the process flow to form the germanium- or carbon-containing stress layers at appropriate locations in or below the channel region. Hence, process complexity is significantly increased, thereby also increasing production costs and the potential for a reduction in production yield.

Another promising approach is the creation of stress in the dielectric material, which is formed after finishing the transistor elements to embed and "passivate" the transistors and which receives metal contacts to provide the electrical connection to the drain/source regions and the gate electrode of the transistors. Typically, this dielectric material comprises at least one etch stop layer and a further dielectric layer that may be selectively etched with respect to the etch stop layer. In order to obtain an efficient stress transfer mechanism to the channel region of the transistor for creating strain therein, the contact etch stop layer, that is located in the vicinity of the channel region, has to be positioned closely to the channel region. However, due to the complex dopant profiles that are usually required in highly advanced transistors, an advanced spacer structure is typically provided including three or more individual spacer elements used as implantation masks in respective implantation steps for appropriately positioning the dopants in the drain and source regions on the basis of suitable implantation parameters. A technique using three individual spacer elements for defining the dopant profile in the drain and source regions will hereinafter also be referred to as a triple spacer approach.

In highly scaled transistor architectures, the performance gain obtained by strain-inducing sources and the reduction of the overall transistor dimensions may, however, be less than desirable, due to several problems associated with further device scaling, as will be described with reference to FIGS. 1a-1b in more detail.

FIG. 1a schematically illustrates a semiconductor device 100 comprising a first transistor 150A and a second transistor 150B, which may represent transistors of different conductivity type, or any other neighboring transistors defining a distance 150D therebetween that may be approximately a few hundred nanometers and significantly less, such as 100 nm and less, for highly scaled semiconductor devices. The transistors 150A, 150B are formed above a substrate 101, such as a bulk silicon substrate or a silicon-on-insulator (SOI) substrate, depending on the overall device configuration. Furthermore, a silicon-based semiconductor layer 102 is formed above the substrate 101 and may comprise isolation structures (not shown) used to define active regions, i.e., regions receiving appropriate dopant concentrations for patterning the conductivity of the base silicon material in a required manner. As shown, the silicon-based layer 102 may comprise drain and source regions 151A, 151B having a complex lateral and vertical concentration profile in order to enhance controllability of a corresponding channel region 152, maintain a low overall series resistance, reduce leakage currents and the like. Depending on the conductivity type of the transistors 150A, 150B, the drain and source regions 151A, 151B may be formed on the basis of P-type dopants and N-type dopants, respectively. The transistors 150A, 150B further comprise a gate electrode 153, which, in the manufacturing stage shown, is typically comprised of polysilicon, and which is formed on a gate insulation layer 154 isolating the gate electrode 153 from a channel region 152. The gate insulation layer 154 may be formed on the basis of silicon dioxide, silicon nitride, silicon oxynitride and the like, wherein a thickness of the gate insulation layer 154 for silicon dioxide based materials has reached 2 nm and less, which is near the physical boundaries for the thickness of gate dielectrics based on silicon dioxide with respect to static leakage currents. Hence, other mechanisms may be required for enhanced channel control, such as increasing the charge carry mobility in the channel region 152, unless appropriate dielectric materials having a moderately high permittivity prove to be reliable candidates for replacing silicon dioxide based materials. The gate electrodes 153 have formed on sidewalls thereof a spacer structure 155 that is provided in the example shown as a triple spacer structure comprising an offset spacer 155A comprised of silicon dioxide, a first spacer element 155B and a second spacer element 155C, which are typically made of silicon nitride. Furthermore, the spacer structure 155 comprises a liner material, such as a silicon dioxide liner 155F, separating the first and second spacer elements 155B, 155C. Similarly, a liner 155E may be formed between the offset spacer 155A and the first spacer 155B.

The semiconductor device 100 may be formed on the basis of well-established process techniques, including the definition of isolation structures (not shown), followed by appropriate implantation techniques for defining a desired vertical dopant distribution within and below the channel regions 152. Thereafter, the gate insulation layer 154, in combination with the gate electrode 153, may be formed on the basis of sophisticated oxidation and/or deposition processes, when a silicon dioxide based material is considered for the layer 154, followed by the deposition of an appropriate gate electrode material, such as polysilicon. Next, the gate electrode material and the gate insulation layer may be patterned on the basis of advanced lithography and etch processes, so that a length of the gate electrode 153 may be obtained in the range of 50 nm and less, wherein the distance between neighboring gate electrodes 153 may also be adjusted to approximately 200 nm and even less in densely packed device areas, as previously explained. Next, a portion of the spacer structure 155, i.e., the offset spacer 155A, may be formed with an appropriate spacer width so as to act, in combination with the gate electrode 153, as an implantation mask for defining a portion of the drain and source regions 151A, 151B. The offset spacer 155A may be formed by depositing a silicon dioxide material in a highly conformal manner and subsequently performing a selective plasma-based etch process using well-established etch chemistries, wherein the etch process parameters are adjusted to obtain a high degree of anisotropy. Thereafter, respective implantation processes may be performed, for instance for amorphizing the silicon-based layer 102 down to a specified depth, incorporating the specific type of dopant species for defining a shallow portion of the drain and source regions 151A, 151B and for increasing the concentration of dopants of opposite conductivity type with respect to the drain and source regions 151A, 151B in order to make the corresponding dopant gradients steeper for defining moderately sharp PN junctions. Next, the liner material 155E may be formed by depositing a silicon dioxide layer followed by the deposition of a silicon nitride material with a specified thickness, followed by a highly anisotropic etch process using an etch chemistry that has a high etch selectivity between the liner material and the spacer material. After the anisotropic etch process, the first spacer elements 155B are obtained and may then be used as an efficient implantation mask for performing another implantation process for incorporating dopant species with appropriately selected implantation parameters, such as energy and dose, in order to obtain the desired penetration depth and concentration. Thereafter, the sequence may be repeated to obtain the second spacer elements 155C to establish the final dopant concentration of the drain and source regions 151A, 151B. Intermittently, or after the entire implantation process is completed, appropriate anneal processes may be performed to re-crystallize the material in the drain and source regions 151A, 151B and to activate the implanted dopant atoms. As previously explained, by using the triple spacer structure 155, the drain and source regions 151A, 151B may be shaped in the vertical and lateral directions so as to obtain a desired high performance of the transistors 150A, 150B. On the other hand, defining the dopant profile of the drain and source regions 151A, 151B on the basis of a less complex spacer structure, for instance by omitting the first spacer element 155B and thus the associated implantation process, in view of enhanced overall process efficiency, may result in reduced performance, since a reduced conductivity of the N-channel transistors may be observed while also increased implantation dose values may have to used for the P-channel transistors to obtain the desired depth of the drain and source regions. That is, for N-channel transistors, the second implantation process may be specifically designed for reducing the series resistance of the drain and source regions, which may be difficult to be achieved on the basis of a single implantation process using the spacer structure in its final state. Similarly, for P-channel transistors, the adjustment of the desired depth of the drain and source regions may be difficult in a single deep drain/source implantation process, in particular when an SOI configuration is considered, in which the P-type dopant is to be placed such that it connects to the buried insulating layer. Hence, when balancing advantages with respect to less complex process flow of a double spacer approach, i.e., offset spacer plus single outer spacer, against the performance gain obtained by the triple spacer approach described above, usually the triple spacer approach is favored.

As previously discussed, additional performance gain may be obtained by inducing a certain type of strain in the channel regions 152, for instance by providing a highly stressed material above the transistors 150A, 150B, wherein the magnitude of strain may depend on the amount and intrinsic stress level of the respective material.

FIG. 1b schematically illustrates the semiconductor device 100 with a first stressed dielectric layer 103A, which may represent a contact etch stop layer, above the first transistor 150A, while a second contact etch stop layer 103AB with a high intrinsic stress level may be formed above the second transistor 150B. In the example shown, the layer 103A has a high compressive stress to induce a respective compressive strain in the channel region 152 of the transistor 150A. Similarly, the transistor 150B may receive a tensile strain caused by a high intrinsic tensile stress of the layer 103AB. Moreover, the transistors 150A, 150B comprise metal silicide regions 105 formed on the drain and source regions 151A, 151B and metal silicide regions 104 formed on the gate electrode 153. Typically, the metal silicide regions 104, 105 may be formed in a common process sequence, for instance on the basis of cobalt, nickel and the like, by depositing a metal layer and initiating a chemical reaction during which the spacer structure 155 exhibits a substantially inert behavior so that non-reacted metal may be readily removed from the spacer structure 155, thereby substantially avoiding the creation of undesired conductive paths between the metal silicide regions 104 and 105. Thereafter, the etch stop layers 103A, 103AB may be formed on the basis of well established deposition and patterning regimes, for instance using silicon nitride material, which may be efficiently deposited by plasma enhanced chemical vapor deposition (PECVD) with a desired high intrinsic stress level. Thereafter, an interlayer dielectric material may be deposited, such as silicon dioxide, which may then be patterned to receive respective contact openings, which may extend down to the metal silicide regions 105.

Thus, for reduced distances 150D (see FIG. 1a), the amount of stressed material of the layers 103A, 103AB may be restricted due to the limitations of the gap fill capabilities of the respective patterning sequence for forming the stress layers 103A, 103AB. Moreover, the stress transfer mechanism provided by the layers 103A, 103AB may be reduced by the subsequent formation of contact openings, since the respective openings may remove a significant portion of the stressed dielectric material in densely packed device areas. Thus, for highly scaled semiconductor devices, the efficiency of the stress transfer mechanism may be significantly reduced. Furthermore, as previously explained, an important factor for the overall transistor performance is the gate series resistance, which strongly depends on the conductivity and the thickness of the metal silicide region 104. Thus, for a reduced channel length, the overall amount of metal silicide in the region 104 may also be reduced, thereby increasing the series resistance of the gate electrode 153, which may translate into increased switching times and thus reduced transistor performance for sophisticated logic devices.

In view of this situation, it has been proposed to remove the outer spacer of the spacer structure 155 prior to performing the silicidation process, thereby at least increasing the amount of metal silicide in the regions 105 and also providing the possibility of positioning an increased amount of highly stressed material in the vicinity of the channel regions 152 so that the formation of the contact openings may have a less pronounced effect on the overall stress transfer mechanism. This approach may result in enhanced transistor performance, thereby, however, requiring additional process steps, which may increase overall production costs.

The present disclosure is directed to various methods and devices that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

Generally, the present disclosure relates to techniques for forming transistor elements having a sophisticated drain and source dopant profile, which may be accomplished on the basis of a highly efficient patterning regime for providing a respective sidewall spacer structure. For this purpose, a single deposition process may be used to form appropriate implantation profiles that may be comparable to profiles obtained by a triple spacer approach, as previously explained. Furthermore, in some illustrative aspects disclosed herein, the number of etch steps for patterning the sidewall spacer structure may be comparable to conventional triple spacer approaches, thereby providing a significantly reduced process complexity while at the same time providing the desired device performance. To this end, the initial spacer layer may be provided with a thickness appropriate for patterning a spacer element having a width that corresponds to the desired width for a deep drain and source implantation for P-channel transistors and for a respective high dose implantation for N-channel transistors. Thereafter, the width of the spacer element may be efficiently reduced by appropriate etch techniques to obtain a reduced width that is appropriate for defining intermediate buffer drain and source regions corresponding to a triple spacer profile. After defining the respective complex drain and source dopant profile, the further processing may be continued on the basis of the spacer element of reduced width, which may also result in enhanced strain-inducing mechanisms on the basis of a stressed interlayer dielectric material, which may now be positioned more closely to the channel region, compared to conventional triple spacer approaches, which may, contrary to the present disclosure in view of further device enhancement, require a further etch step, if enhanced strain is desired in the channel region. Thus, device performance according to triple spacer approaches may be achieved on the basis of a less complex process sequence, while, in other cases, a comparable complexity of the process sequence may result in enhanced device performance, since a high degree of flexibility in appropriately adjusting the spacer width at corresponding manufacturing stages may be accomplished according to the principles disclosed herein.

One illustrative method disclosed herein comprises forming a sidewall spacer element at sidewalls of a gate electrode structure of a transistor by forming an etch stop layer and a spacer layer and performing an anisotropic etch process using the etch stop layer as an etch stop material. The method further comprises forming outer drain and source areas of drain and source regions of the transistor by using the sidewall spacer element as a first implantation mask. Furthermore, the method comprises removing a portion of the spacer element to obtain a first reduced width, and forming an intermediate portion of the drain and source regions by using the spacer element with the first reduced width as a second implantation mask.

A further illustrative method disclosed herein comprises forming a homogenous spacer layer above a transistor and etching the homogenous spacer layer to form a sidewall spacer at a sidewall of a gate electrode structure of the transistor. The method further comprises performing a first implantation process to form a first portion of the drain and source regions of the transistor and reducing a width of the sidewall spacer element. Finally, the method comprises performing a second implantation process to form a second portion of drain and source regions of the transistor.

A still further illustrative method disclosed herein comprises determining a first target width of a spacer element for defining deep drain and source regions of a specified type of transistor. Furthermore, a second target width of a spacer element for defining intermediate drain and source regions of the specified type of transistor is determined. Additionally, the method comprises forming an etch stop layer above one or more substrates, wherein each of the substrates includes the specified type of transistor. Additionally, the method comprises forming a spacer layer on the etch stop layer on the basis of the first target width and etching the spacer layer to form the spacer element by using the etch stop layer as an etch stop material. Moreover, based on the spacer element, the deep drain and source regions are formed and the width of the spacer element is reduced on the basis of the second target width. Finally, the intermediate drain and source regions are formed.

BRIEF DESCRIPTION OF THE DRAWINGS

The disclosure may be understood by reference to the following description taken in conjunction with the accompanying drawings, in which like reference numerals identify like elements, and in which.

Figure 1A:
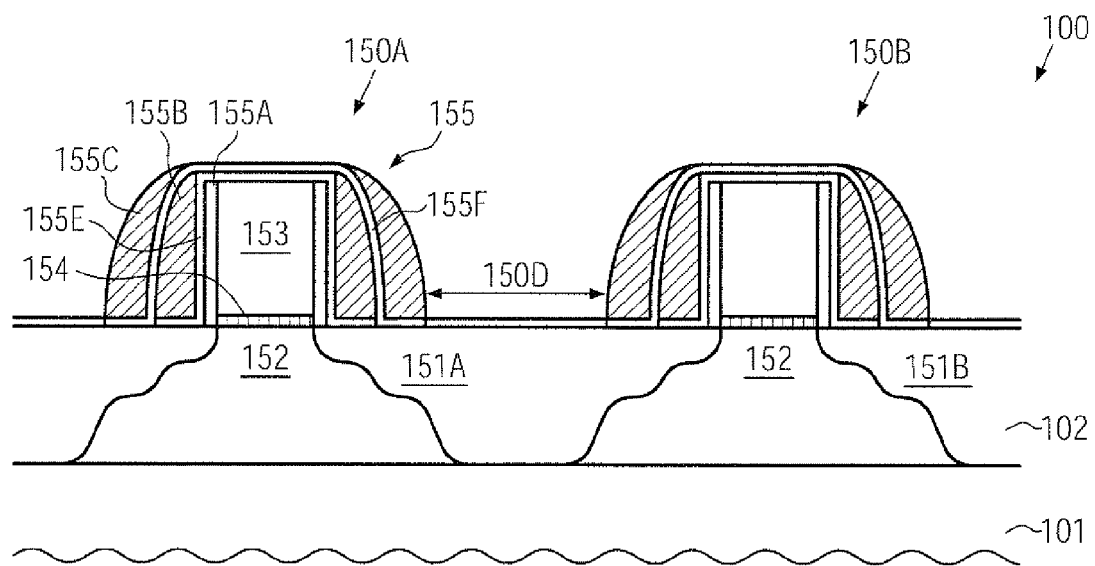
FIGS. 1a-1b schematically illustrate cross-sectional views of a semiconductor device including closely spaced transistor elements formed on the basis of a triple spacer approach and a first interlayer dielectric material during various manufacturing stages, according to conventional manufacturing techniques.
Figure 1B:
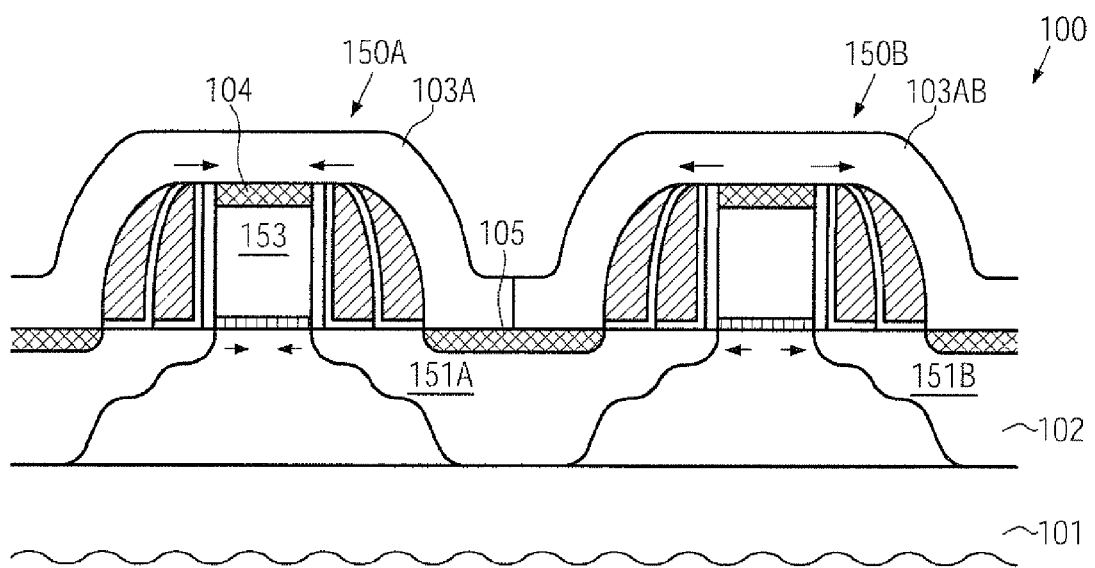

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the principles disclosed herein provide enhanced techniques in which sophisticated dopant profiles may be formed on the basis of a spacer structure of reduced complexity, thereby obtaining a high transistor performance, while at the same time the complexity of the manufacturing sequence may be reduced. For this purpose, a spacer structure may be formed on the basis of a spacer layer having an appropriate initial thickness which corresponds to a spacer width as required for defining the outermost drain and source areas of the transistor so that the corresponding drain and source areas may be defined on the basis of a patterning regime including a deposition process followed by a subsequent anisotropic etch process. After defining the outer or deep drain and source regions, the spacer width may be reduced on the basis of an etch time controlled process which, in some illustrative embodiments, may be accomplished by using well-controllable selective etch recipes on the basis of wet chemical techniques to obtain a desired reduced target thickness for forming intermediate drain and source areas, which may substantially correspond to the horizontal and vertical dopant profile as obtained by conventional triple spacer approaches. Consequently, applying a single deposition process in combination with two etch processes, similar drain and source profiles may be accomplished, as in sophisticated triple spacer approaches, while, additionally, further transistor enhancement may be gained according to the principles disclosed herein, since the series resistance of the drain and source current path may be reduced by more closely positioning the highly conductive metal silicide regions to the PN junctions. Similarly, stressed dielectric material may be positioned with a reduced offset to the channel region of the transistor, thereby also enhancing the overall performance of the transistor. In conventional triple spacer approaches, a respective additional gain in performance may require at least one further etch process, thereby even further contributing to the overall process complexity.

Thus, the subject matter disclosed herein is highly advantageous in the context of sophisticated semiconductor devices comprising advanced transistor elements with a gate length of approximately 50 nm and less, in which transistor performance may be enhanced by providing stressed dielectric materials above the transistor element. In this case, the sophisticated dopant profile may be provided in combination with an efficient stress transfer mechanism along with a reduced resistance in the gate electrode and also in the conductive path formed by the drain and source regions and the channel region while avoiding one or more complex processes, such as a deposition process for a spacer layer, an etch process and the like. Furthermore, in device areas having a high integration density, a distance between neighboring circuit elements, which, in the final phase of the manufacturing sequence may be determined by the width of the respective spacer structure, may be efficiently reduced, thereby also enhancing the patterning regime for forming respective contact openings, since the metal silicide area, to which the contact openings have to connect, is increased, thereby relaxing the constraints with respect to alignment accuracy. Additionally, the amount of stressed dielectric material surrounding the contact metal may be increased, thereby also reducing the negative effect of the contacts with respect to stress relaxation, since the ratio between stressed dielectric material and stress relaxing metal in the contacts is increased. It should be appreciated, however, that the principles disclosed herein may also be advantageously applied to any transistor configuration, irrespective of the dimensions thereof, unless such restrictions are explicitly referred to in the claims and/or the specification.

Figure 2A:
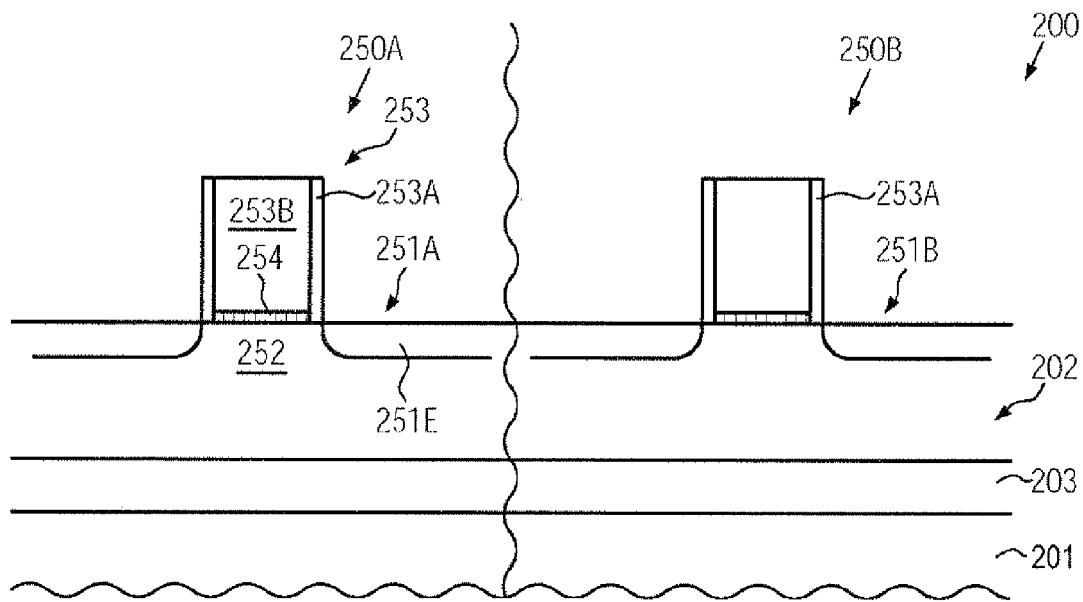
FIGS. 2a-2g schematically illustrate cross-sectional views of a semiconductor device comprising transistor elements during various manufacturing stages for defining a complex lateral and vertical dopant profile on the basis of a spacer structure of reduced complexity, the size of which may be reduced after defining outer or deep drain and source regions, according to illustrative embodiments.

FIG. 2a schematically illustrates a semiconductor device 200, which may comprise one or more transistor elements 250A, 250B at an early manufacturing stage. The transistors 250A, 250B may represent transistors of different conductivity type, such as an N-channel transistor and a P-channel transistor, or may represent similar transistors formed in a specific device region, which may include individual transistors with a reduced spacing therebetween. The semiconductor device 200 may comprise a substrate 201, such as a bulk semiconductor substrate having formed thereabove an appropriate semiconductor layer 202, which may be comprised of a silicon-based material, while other components, such as germanium, carbon, tin or any appropriate dopant species, may also be incorporated in the semiconductor layer 202. In the embodiment shown, a buried insulating layer 203 may be provided, thereby defining a semiconductor-on-insulator (SOI) configuration, wherein the SOI configuration may be provided globally across the entire substrate 201, while, in other cases, an SOI configuration and a bulk configuration may be provided in the same semiconductor device, depending on the overall device requirements. Furthermore, in the manufacturing stage shown, each of the transistors 250A, 250B may comprise a gate electrode structure 253, which may comprise an electrode portion 253B and an offset spacer element 253A, which may be comprised of any appropriate material, as is also previously explained with reference to the offset spacer 155A. Similarly, the electrode material 253B may be comprised of polysilicon and the like, depending on the overall device strategy. The gate electrode material 253B may be separated from a channel region 252 by a gate insulation layer 254. Furthermore, in this manufacturing stage, a portion of the respective drain and source regions 251A, 251B, indicated as 251E, which may also be referred to as an extension region, may be formed in the semiconductor layer 202 with a desired depth and dopant concentration in conformity with the device requirements. That is, if the transistor 250A represents an N-channel transistor, corresponding N-type dopants may be provided in the extension region 251E of the transistor 250A, while a P-type dopant may be provided in the extension region 251E of the transistor 250B, when representing a P-channel transistor.

The semiconductor device 200 as shown in FIG. 2a may be formed on the basis of similar process techniques, as previously described with reference to the device 100. That is, after patterning the gate electrode structures 253, including the offset spacer elements 253A, an appropriately designed sequence of implantation processes may be performed in order to obtain the extension regions 251E with appropriate characteristics in accordance with the requirements for the transistors 250A, 250B.

Figure 2B:
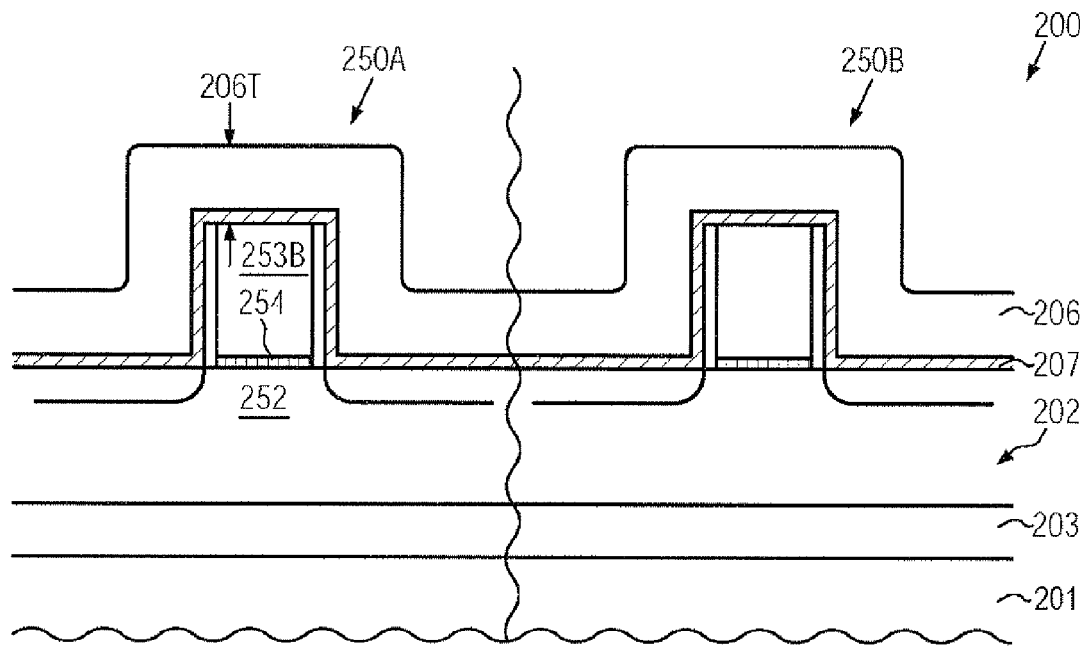

FIG. 2b schematically illustrates the semiconductor device 200 in a further advanced manufacturing stage. As shown, a spacer layer 206 may be formed above the transistors 250A, 250B, wherein a thickness 206T of the spacer layer 206 may be appropriately selected in accordance with a target width of a spacer element to be formed from the spacer layer 206 in a subsequent manufacturing stage, wherein the target width corresponds to a desired offset of outermost or far drain and source areas to be formed in the regions 251A, 251B. In the embodiment shown, an etch stop layer 207 may be provided in combination with the spacer layer 206 and may be comprised of any appropriate material having a desired high etch selectivity with respect to the material of the spacer layer 206. For instance, in one illustrative embodiment, the etch stop layer 207 may be provided in the form of a silicon dioxide material and the spacer layer 206 may be provided in the form of silicon nitride, silicon oxynitride, nitrogen-containing silicon carbide and the like, wherein a combination of silicon dioxide and silicon nitride may provide a high degree of compatibility with conventional spacer manufacturing techniques. The spacer layer 206 may be provided in the form of a substantially homogenous material composition, i.e., the spacer layer 206 may represent, in some illustrative embodiments, a single material composition. However, process-induced variations of material characteristics may nevertheless occur. That is, after the deposition of the etch stop layer 207 on the basis of well-established deposition techniques, such as plasma enhanced chemical vapor deposition, thermally activated chemical vapor deposition and the like, the spacer layer 206 may be deposited on the basis of a single and continuous process, the process time of which may be controlled on the basis of desired target thickness or otherwise predetermined deposition parameters.

As previously discussed, the target thickness and thus a width of spacer elements to be formed from the spacer layer 206, may be determined in advance, for instance, by referring to respective target values used in conventional triple spacer approaches, since the spacer element obtained from the layer 206 may represent the layer for forming the outermost spacer elements of a triple spacer structure. Thus, well-established deposition techniques, such as low pressure chemical vapor deposition, atomic layer deposition and other cyclic deposition techniques, in which materials of different precursors may be alternatingly deposited, may be used, thereby obtaining enhanced overall process control. Thereafter, an anisotropic etch process may be performed, which may be accomplished by using well-established etch recipes, in order to form respective spacer elements, the width of which may be substantially defined by the initial layer thickness 206T and the corresponding etch parameters.

Figure 2C:
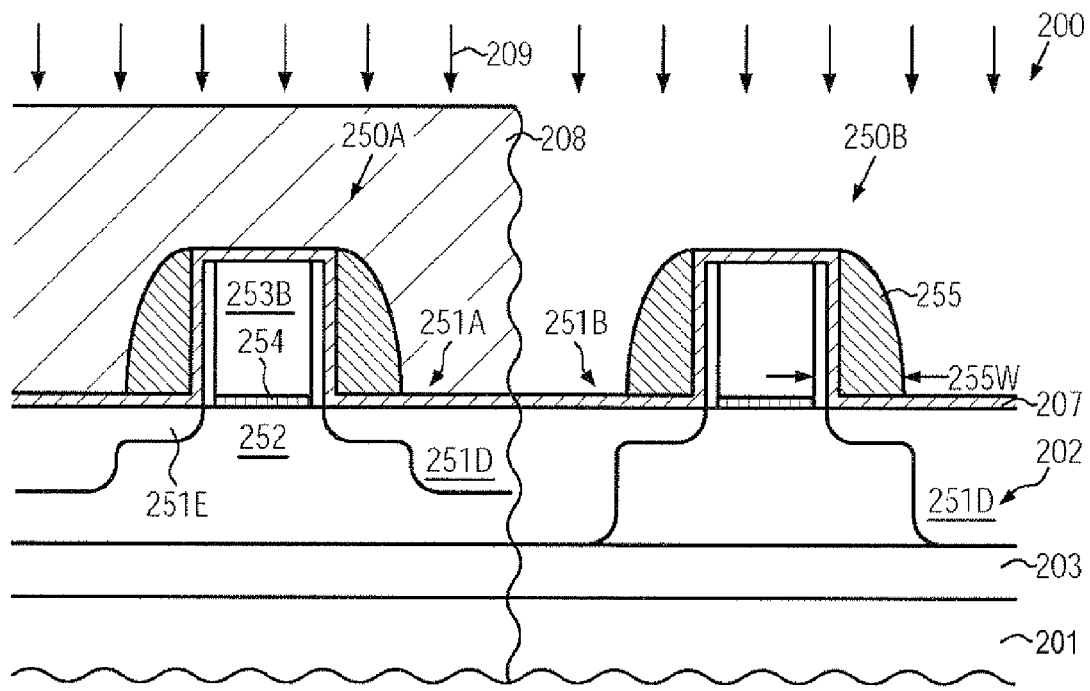

FIG. 2c schematically illustrates the semiconductor device 200 in a further advanced manufacturing stage. As illustrated, each of the transistors 250A, 250B may comprise spacer elements 255 at sidewalls of the gate electrode structures 253, wherein a width 255W corresponds to an offset with respect to the gate electrode structure 253 as may be required for defining outer or deep drain and source regions 251D. It should be appreciated that the depth of the "deep" drain and source regions 25 ID may not represent a final depth of the drain and source regions 251A, 251B. That is, in some cases, the outer regions 251D of the drain and source regions may be provided with an increased dopant concentration by using high implantation energies as may, for instance, be appropriate for N-channel transistors, while, in other cases, for instance in the transistor 250B, the deep drain and source regions 251D may be formed on the basis of appropriate implantation energies so as to connect to the buried insulating layer 203 when an SOI configuration is considered. It should be appreciated, however, that any other desired vertical profiling may be created, depending on the overall device requirements. Furthermore, it is to be noted that the spacer width 255W may also include the thickness of the etch stop layer 207 and of the offset spacer 253A of the gate electrode structure 253.

Furthermore, in the manufacturing stage shown, an implantation mask 208 may be provided, for instance for shielding the transistor 250A while implanting the dopant species for the deep drain and source region 251D of the transistor 250B during an ion implantation process 209. Thus, in the embodiment shown, a respective implantation process has been performed for the transistor 250A, while, in other cases, a reverse order of these implantation processes may be used. After the implantation process 209, depending on the process requirements, anneal processes may be performed or a respective anneal sequence may be performed at a later manufacturing stage, after carrying out further implantation processes for defining the entire drain and source regions 251A, 251B, except for a potential fine-tuning of the final profile during the annealing of the device 200. Furthermore, after the removal of the implantation mask 208, in one illustrative embodiment, the device 200 may be subjected to a wet chemical etch process designed to reduce the width of the spacer elements 255 in accordance with a specified target width that is selected to define the further profiling of the drain and source regions 251A, 251B of the transistors 250A, 250B.

Figure 2D:
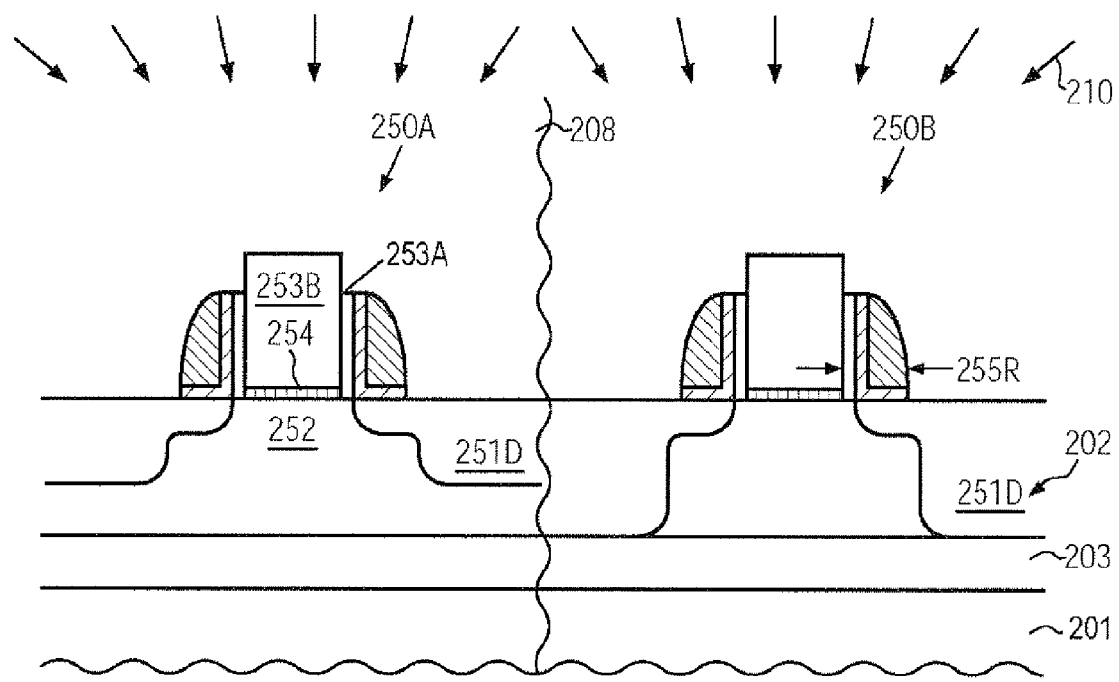

FIG. 2d schematically illustrates the device 200 when exposed to a wet chemical etch ambient 210, which may have a substantially isotropic etch behavior, thereby reducing the width of the spacer elements 255 and also the height thereof. In one illustrative embodiment, the etch ambient 210 may be established by a mixture of hydrofluoric acid (HF) and ethylene glycol, wherein the hydrofluoric acid may be "diluted" in the ethylene glycol in order to obtain approximately a concentration of approximately 1-10 percent hydrofluoric acid, which may result in an efficient etch rate for silicon nitride material, while also etching silicon dioxide, however, at a lower etch rate. For instance, the etch rate for silicon dioxide material may be approximately one-half of the etch rate of silicon nitride within the above-specified range, thereby efficiently reducing the thickness of the spacer 255 while appropriately delaying the exposure of the gate electrode material 253B and of the semiconductor layer 202 to the etch ambient 210. That is, due to the increased etch rate for material of the spacer element 255, the width thereof may be increasingly reduced, while still a certain degree of coverage of the silicon areas in the gate electrode structure 253 and the semiconductor layer 202 may be accomplished.

It should be appreciated, however, that the etch ambient 210 may also exhibit a moderately high selectivity with respect to silicon material, thereby providing sufficient process margins with respect to undue material removal of exposed silicon areas. Furthermore, generally, the etch ambient 210 may be adjusted such that a moderately low overall removal rate may be achieved, thereby enhancing the overall controllability of the etch process 210. Respective removal rates may be obtained by experiments, for instance by determining the reduction in width for a plurality of specified etch recipes, wherein appropriate process conditions may also be selected in order to reduce any microloading effects during the process 210. Microloading effects may represent a pattern-dependent variation of the removal rate during the etch process 210, which may result in across-substrate variations, depending on the pattern density, i.e., the distance between neighboring feature elements, such as the transistors 250A, 250B. Consequently, by selecting appropriate process conditions, highly uniform removal rates may be obtained across the substrate 201, thereby also providing a degree of uniformity of the respective transistor characteristics, which may depend on the horizontal and vertical dopant profile of the drain and source regions 251A, 251B, as previously discussed. In other illustrative embodiments, the etch process 210 may comprise a plasma assisted process, which may include a certain isotropic component of the etch process, thereby enabling an efficient reduction of spacer width. As shown in FIG. 2d, a reduced width 255R may be obtained in accordance with the predetermined target width, which may, for instance, correspond to the width of inner spacer elements of a triple spacer structure, as previously described with reference to the device 100. Furthermore, exposed portions of etch stop layer 207 on the semiconductor layer 202 and sidewalls of the gate electrode structure 253 may have been removed, wherein an upper portion of the offset spacer 253A may also be removed, depending on material composition.

Figure 2E:
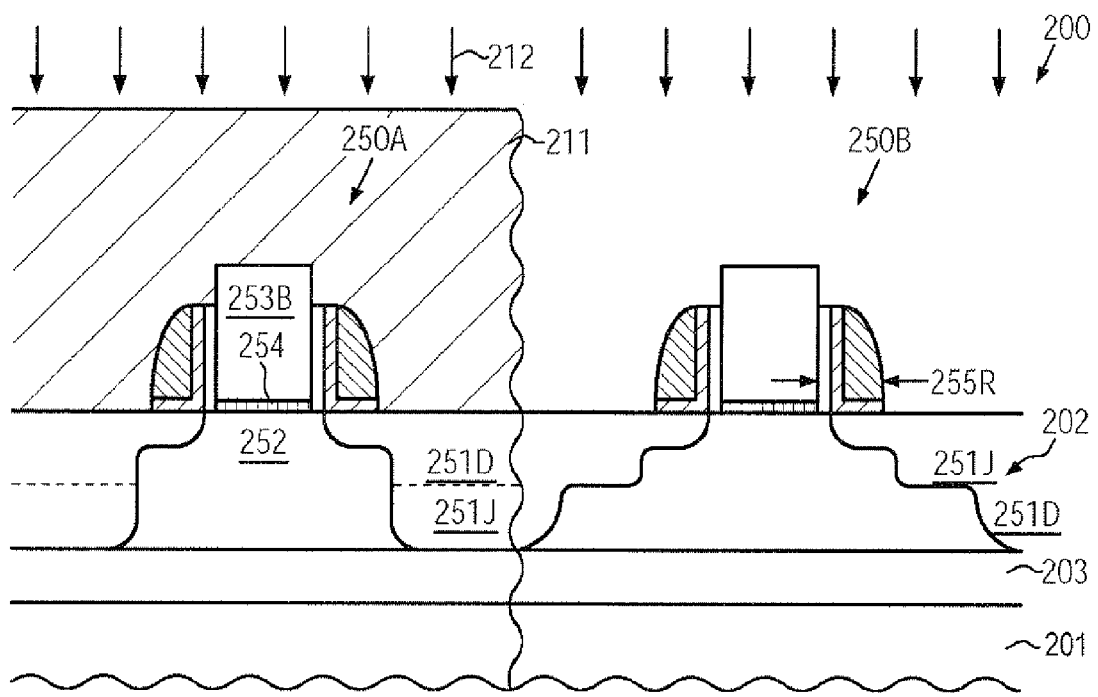

FIG. 2e schematically illustrates the semiconductor device 200 in a further advanced manufacturing stage, in which a further implantation process 212 may be performed on the basis of an appropriate implantation mask 211 in order to obtain intermediate drain and source regions 251J for the transistor 250B. In the sequence shown, respective intermediate drain and source regions 251J may also be provided in the transistor 250A, which may be accomplished by a corresponding implantation process in which the transistor 250B may be masked. Similarly, as before, also in this case, the respective sequence of implantation processes may be reversed, depending on the overall process requirements. Thereafter, the implantation mask 211 may be removed and the device 200 may be subjected to an anneal process or a cycle of anneal processes in order to activate the dopant of the drain and source regions 251A, 251B and also to re-crystallize implantation-induced damage. For the corresponding anneal processes, in some cases, well-established process parameters may be used according to conventional triple spacer approaches, since the resulting dopant profiles may be very similar to corresponding dopant profiles of conventional strategies. In some illustrative embodiments, the reduced height of the spacer element 255 having the reduced width 255R in the transistor 250A may be compensated for by appropriately reducing the implantation energy, if the ion-blocking effect of the spacer element 255 may be considered inappropriate.

Thereafter, the further processing may be continued on the basis of the spacer element 255 having the reduced width 255R, i.e., a silicidation process may be performed wherein the reduced width 255R may further provide an increased metal silicide area, thereby providing advantages with respect to electrical conductivity, alignment tolerances during the formation of contacts, as previously discussed, and the like.

Figure 2F:
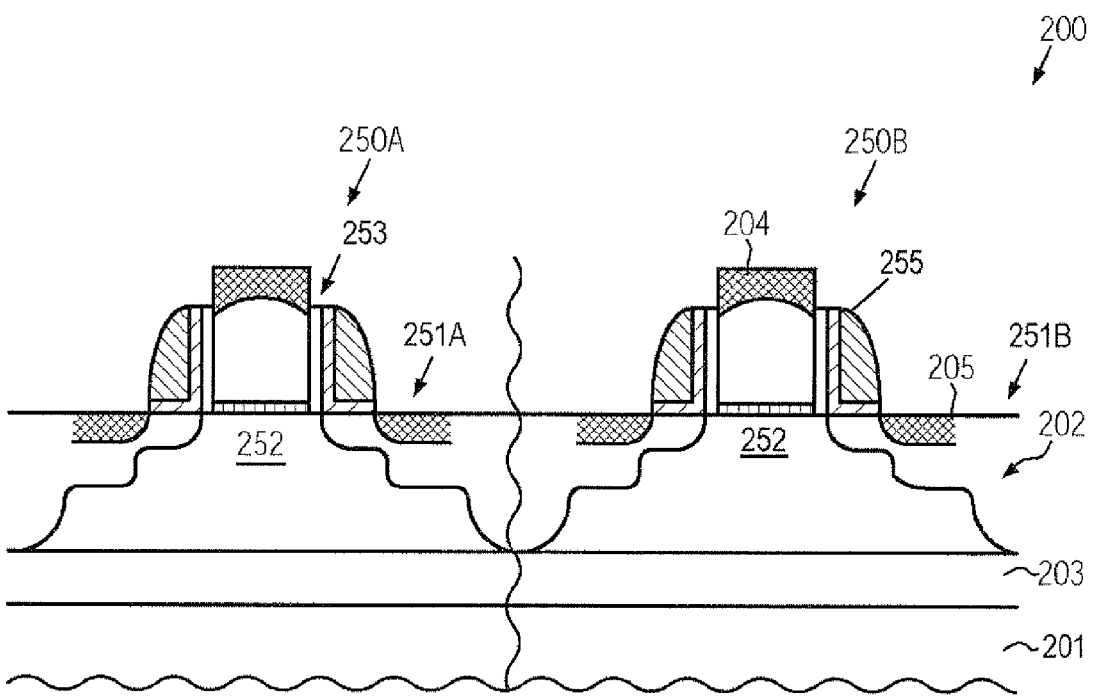

FIG. 2f schematically illustrates the semiconductor device 200 in which metal silicide regions 204 may be formed in the gate electrode structures 253, wherein, due to the reduction of the height of the spacers 255, an increased surface area is available for the silicidation process. Consequently, the amount of metal silicide and thus the overall conductivity of the gate electrode 253B may be increased. Similarly, metal silicide regions 205 may be formed in the drain and source regions 251A, 251B, wherein a lateral distance to the channel region 252 may be reduced, due to the reduced width 255R. The metal silicide regions 204, 205 may be formed on the basis of well-established process techniques, as also previously described.

Figure 2G:
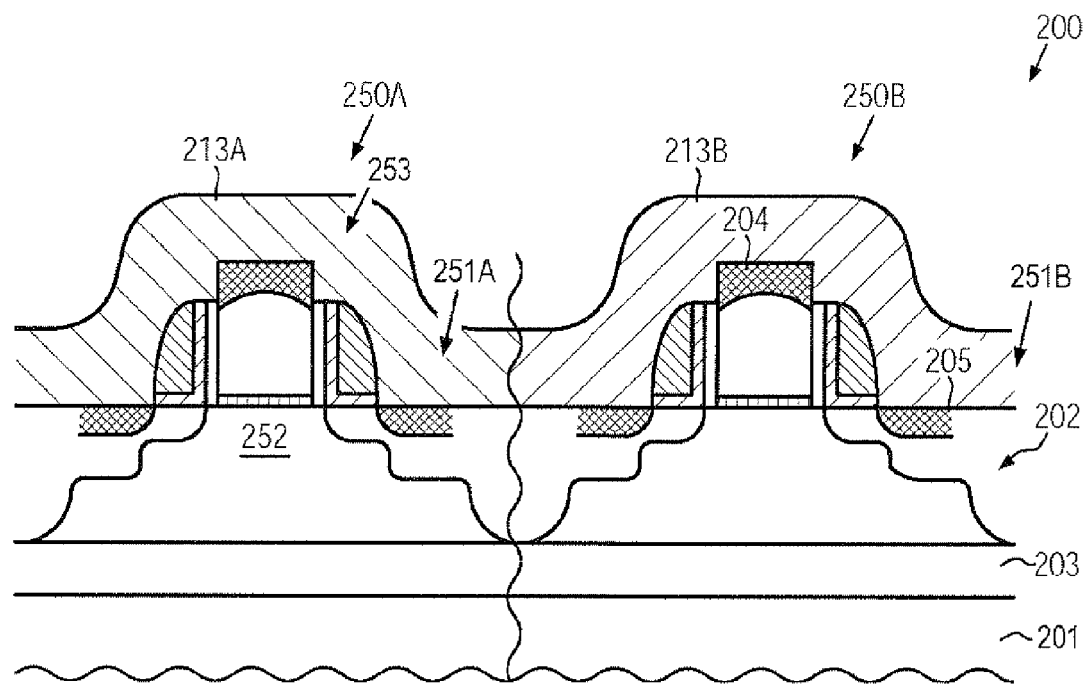

FIG. 2g schematically illustrates the semiconductor device 200 in a further advanced manufacturing stage, in which a strain-inducing dielectric material 213A may be formed above the transistor 250A, and a strain-inducing material 213B may be formed above the transistor 250B, wherein an internal stress level of the layers 213A, 213B may be appropriately selected to enhance the performance of the underlying transistor elements. For example, a high internal tensile stress may be provided in the layer 213A, thereby enhancing electron mobility in the channel region 252 of the transistor 250A, as previously explained. On the other hand, the layer 213B may be provided with high internal compressive stress, thereby enhancing the mobility of holes in the channel region 252 of the transistor 250B. Furthermore, due to the reduced width 255R (FIG. 2e), an increased amount of highly-stressed dielectric material may be positioned laterally adjacent to the gate electrode structures 253, thereby more efficiently compensating for any stress-relaxing effects of contacts that may have to be formed to connect to the drain and source regions 251A, 251B. Furthermore, the high internal stress level may act more efficiently on the adjacent channel region 252 due to the reduced distance, while also the reduced stress absorption of the spacer element of reduced width 255R may result in an overall gain in device performance.

Consequently, in addition to reducing the overall complexity of the manufacturing sequence, sophisticated dopant profiles may also be accomplished, while also providing a reduced spacer width at a final phase of the transistor manufacturing process, thereby also obtaining enhanced electrical characteristics by improving the strain-inducing mechanism and increasing the overall conductivity of the gate electrode structure 253 and the drain and source regions 251A, 251B.

Figure 2H:
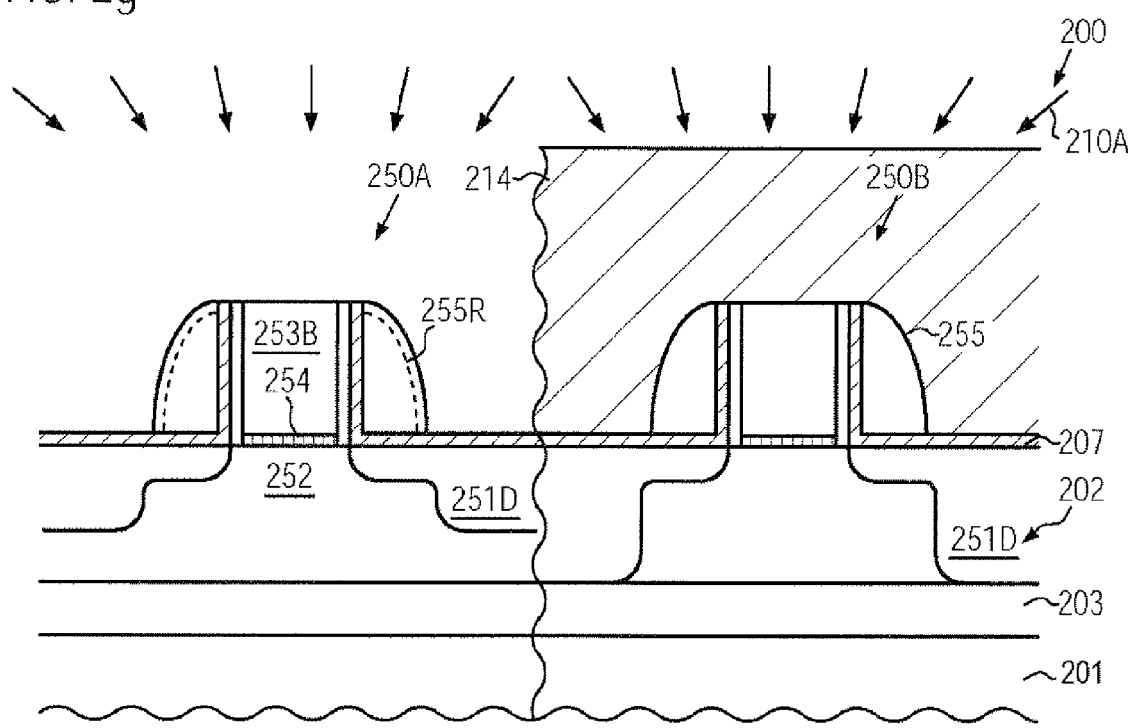
FIG. 2h schematically illustrates a cross-sectional view of a semiconductor device including transistors of different type, in which a reduction of the spacer width may be performed differently so as to individually adapt the overall dopant profile according to still other illustrative embodiments.

With reference to FIG. 2h, further illustrative embodiments will now be described, in which an increased degree of flexibility in adjusting the width of the spacer element 255 may be achieved, while maintaining overall process complexity at a level that is comparable to conventional triple spacer approaches.

FIG. 2h schematically illustrates the semiconductor device 200 in a manufacturing stage in which the outer or deep drain and source regions 251D may have been formed, for instance, on the basis of the process techniques as previously described. Thereafter, an etch mask 214 may be formed above one of the transistors 250A, 250B, in order to allow an individual adaptation of the degree of reduction in spacer width in the transistors 250A, 250B. In the embodiment shown, the transistor 250B may be covered by the mask 214 so as to expose the transistor 250A to an etch ambient 210A, which may be established on substantially the same process parameters as previously explained with reference to the process 210. Thus, an appropriate wet chemical etch chemistry may be used, as previously explained, or any isotropic plasma-assisted etch processes may be employed. During the process 210A, the width and also the height of the spacer 255 may be reduced to a desired degree, as is, for instance, indicated by the dashed line 255R. Thereafter, according to one illustrative embodiment, an implantation process may be performed while using the etch mask 214 as an implantation mask, thereby forming the intermediate drain and source regions 251J (FIG. 2e) on the basis of the reduced width 255R, as also previously explained. After the removal of the etch/implantation mask 214, a corresponding etch/implantation mask may be formed above the transistor 250A, and a further etch ambient may be established to appropriately reduce the width of the spacer element 255 of the transistor 250B. Thereafter, a respective implantation process may be performed in order to define the corresponding intermediate drain and source region 251J. Thereafter, the further processing may be continued, as previously described.

Consequently, additional flexibility in shaping the lateral and vertical dopant profile of different types of transistors may be achieved without requiring additional lithography processes, while only one additional etch step may be required, thereby obtaining a similar degree of complexity compared to conventional triple spacer approaches, while significantly increasing the overall process flexibility.

With reference to FIGS. 3a-3d, further illustrative embodiments will now be described, in which one or more additional etch steps may be implemented for appropriately adapting the spacer width in accordance with a specific manufacturing stage.

Figure 3A:
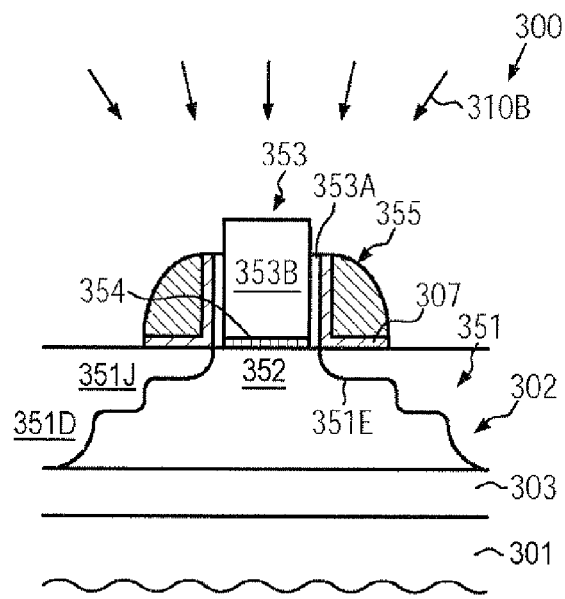
FIGS. 3a-3d schematically illustrate cross-sectional views of a transistor element during various manufacturing stages after forming a complex lateral and vertical dopant profile with a subsequent adaptation of the spacer width for the further processing of the transistor, according to yet other illustrative embodiments.

FIG. 3A schematically illustrates a transistor 300 comprising a substrate 301, above which is formed a semiconductor layer 302. Furthermore, the transistor 300 may comprise a gate electrode structure 353 including a gate electrode 353B and an offset spacer element 353A. A gate insulation layer 354 separates the gate electrode 353B from a channel region 352, which is laterally enclosed between drain and source regions 351, which may comprise an extension region 351E, an intermediate region 351J and a deep or outer region 351D. Furthermore, a spacer element 355 may be provided in combination with an etch stop liner 307. With respect to the components described so far, the same criteria apply as previously explained with reference to the device 200. Hence, a detailed description of the respective components will be omitted here. The transistor 300 may be formed on the basis of process techniques as previously described with reference to the transistors 250A, 250B. In particular the drain and source regions 351 may be defined on the basis of an initial spacer width of the element 355 that is appropriately selected so as to define the position of the outer or deep portion 351D prior to forming the intermediate region 351J, as previously explained. Thereafter, the width of the spacer element 355 may be reduced to an appropriate value corresponding to the desired lateral position of the intermediate region 351J. Furthermore, the transistor 300 may be exposed to a further etch process 310B that may be established based on similar process parameters and etch chemistries as previously explained with reference to the etch processes 210, 210A.

Hence, in one illustrative embodiment, hydrofluoric acid in combination with ethylene glycol may be used in order to reduce the width and the height of the spacer element 355, while also removing exposed portions of the etch stop layer 307 and of the offset spacers 353A, however, at a reduced etch rate, thereby substantially avoiding an undercut of the spacer element 355. Thus, the exposure of sidewall portions of the gate electrode 353B, as well as a lateral distance of exposed portions of the drain and source regions 351 with respect to the gate electrode 353B, may be adjusted in a highly controllable manner by means of the etch process 310B.

Figure 3B:
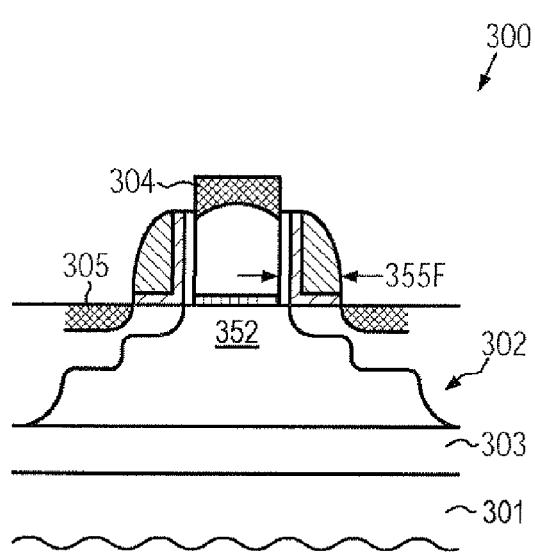

FIG. 3b schematically illustrates the transistor 300 after completing the etch process 310B. Consequently, a reduced width 355F may define the size and the lateral distance of metal silicide regions 305, while also the reduced height of the spacer 355 may provide an increased volume of a metal silicide region 304 in the gate electrode 353B. Thereafter, the further processing may be continued by depositing a highly stressed dielectric material, as also previously discussed.

Figure 3C:
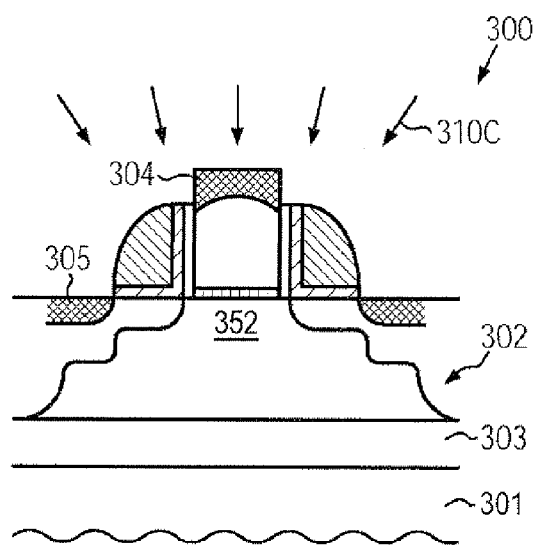

FIG. 3c schematically illustrates the transistor 300 according to other illustrative embodiments, in which the metal silicide regions 304, 305 may be formed on the basis of the sidewall spacer element 355 as shown in FIG. 3a prior to performing the etch process 310B, if the corresponding width is considered appropriate for forming the metal silicide regions 304, 305. In this case, prior to the deposition of a highly stressed material, a further etch process 310C may be performed in order to at least remove the spacer element 355, for instance, in a selective manner with respect to the etch stop layer 307 prior to the deposition of a highly stressed dielectric material. For example, selective wet chemical etch recipes may be used, such as phosphoric acid and the like, thereby efficiently removing silicon nitride material while not unduly affecting the metal silicide regions 304, 305.

Consequently, with an additional etch step, further enhanced device performance may be accomplished, while still maintaining the overall process complexity at a lower level compared to conventional strategies. That is, during the formation of the transistor 300, one deposition process and two etch processes may have been used for forming the spacer element 355 as shown in FIG. 3c. Thus, compared to a conventional triple spacer approach, in which spacer elements may be removed prior to the deposition of a stressed dielectric material, a reduced degree of complexity may be accomplished. Upon performing the etch process 310C, a further enhancement of the overall strain transfer mechanism may be accomplished, thereby providing a similar degree of complexity compared to the conventional strategies for the benefit of a significantly enhanced performance.

Figure 3D:
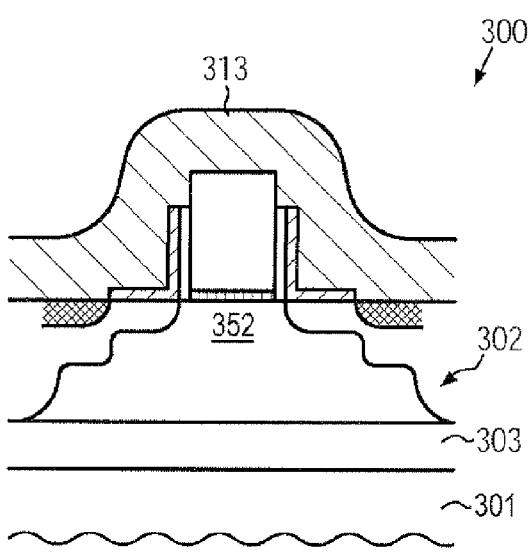

FIG. 3d schematically illustrates the transistor 300 after the deposition of a stressed dielectric material 313, which may be positioned close to the channel region 352, while, on the hand, the metal silicide regions may have been positioned on the basis of the spacer element 355 as shown in FIG. 3c.

As a result, the principles disclosed herein provide enhanced transistor performance at a reduced degree of process complexity by forming a sidewall spacer element in a single deposition step and using the sidewall spacer for defining deep drain and source regions or the outermost portions of the respective drain and source areas. Thereafter, the spacer may be reduced in size by a highly controllable etch process, such as a wet chemical etch process, for instance on the basis of hydrofluoric acid and ethylene glycol, thereby providing an intermediate spacer width for a further implantation sequence. Thus, a single deposition process in combination with two etch steps may provide a complex lateral and vertical dopant profile, comparable to triple spacer approaches, while also increasing the amount of metal silicide formed in the drain and source regions and the gate electrode structure while additionally providing an increased amount of highly stressed dielectric material at a reduced distance to the channel region.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a spacer element comprising an etch stop layer portion and a spacer layer portion at sidewalls of a gate electrode structure of a transistor by forming an etch stop layer and a spacer layer and performing an anisotropic etch process using said etch stop layer as an etch stop;
    forming first drain and source areas of drain and source regions of said transistor by using said sidewall spacer element as a first implantation mask;
    reducing a width of said spacer element to a first reduced width by removing only a first portion of said spacer layer portion of said spacer element; and
    forming an intermediate portion of said drain and source regions by using the spacer element with said first reduced width as a second implantation mask.

2. The method of claim 1, further comprising forming drain and source extension regions of said drain and source regions prior to forming said sidewall spacer element.

3. The method of claim 1, further comprising forming a metal silicide in said drain and source regions on the basis of the spacer element with said first reduced width.

4. The method of claim 1, wherein removing only said first portion of said spacer layer portion of said spacer element comprises performing a wet chemical etch process.

5. The method of claim 4, wherein performing said wet chemical etch process comprises using hydrofluoric acid (HF) diluted in ethylene glycol.

6. The method of claim 1, further comprising forming a stress-inducing dielectric material above said spacer element with said first reduced width.

7. The method of claim 1, wherein said spacer layer is comprised of a nitrogen-containing material and said etch stop layer comprises silicon dioxide.

8. The method of claim 1, wherein said spacer layer is comprised of silicon dioxide and said etch stop layer comprises a nitrogen-containing material.

9. The method of claim 1, further comprising reducing said width of said spacer element to a second reduced width by removing only a second portion of said spacer layer portion of said spacer element with said first reduced width.

10. The method of claim 9, further comprising forming metal silicide regions in said drain and source regions on the basis of said spacer element with the second reduced width.

11. The method of claim 1, further comprising forming a second sidewall spacer element at sidewalls of a second gate electrode structure of a second transistor and said sidewall spacer element in a common process sequence and removing a portion of said second sidewall spacer element so as to form said second sidewall spacer element with a reduced width that differs from said first reduced width of said sidewall spacer element.

12. The method of claim 11, wherein removing a portion of said second sidewall spacer element comprises implanting a dopant species into said second transistor while covering said transistor with an implantation mask and performing an etch process in the presence of said implantation mask.

13. The method of claim 1, further comprising forming offset spacers on said sidewalls of said gate electrode structure prior to forming said spacer element.

14. A method, comprising:
forming a spacer layer having a substantially homogenous material composition above a transistor;
etching said spacer layer to form a sidewall spacer element at a sidewall of a gate electrode structure of said transistor, wherein said sidewall spacer element comprises a first portion and a second portion, said first and second portions each comprising material of said spacer layer;
performing a first implantation process to form a first portion of drain and source regions of said transistor;
reducing a width of said sidewall spacer element by removing only said first portion of said sidewall spacer element and leaving said second portion; and
after reducing said width, performing a second implantation process to form a second portion of said drain and source regions of said transistor.

15. The method of claim 14, wherein reducing a width of said sidewall spacer element comprises performing a wet chemical etch process.

16. The method of claim 15, wherein the wet chemical etch process is performed on the basis of hydrofluoric acid and ethylene glycol.

17. The method of claim 14, further comprising forming drain and source extension regions prior to forming said spacer layer.

18. The method of claim 17, further comprising forming metal silicide regions on the basis of said sidewall spacer element having said reduced width.

19. The method of claim 14, further comprising further reducing the width of said sidewall spacer element after performing said second implantation process.

20. The method of claim 14, further comprising forming an offset spacer on said sidewall of said gate electrode structure and forming an etch stop layer on said offset spacer prior to forming said spacer element.

21. A method, comprising:
determining a first target width of a spacer element for defining deep drain and source regions of a specified type of transistor;
determining a second target width of a spacer element for defining intermediate drain and source regions of said specified type of transistor;
forming an etch stop layer above one or more substrates, each of said one or more substrates including said specified type of transistor;
forming a spacer layer on said etch stop layer on the basis of said first target width;
etching said spacer layer to form said spacer element by using said etch stop layer as an etch stop, said spacer element comprising an etch stop layer portion and a spacer layer portion;
forming said deep drain and source regions;
reducing a width of said spacer element on the basis of said second target width by removing only a first portion of said spacer layer portion of said spacer element; and
forming said intermediate drain and source regions.

22. The method of claim 21, further comprising determining a third target width of said spacer element, wherein said third target width is less than said second target width, and adjusting a width of said spacer element on the basis of said third target width by removing only a second portion of said spacer layer portion of said spacer element and forming a stressed dielectric material above said one or more substrates.

23. The method of claim 22, wherein a width of said spacer element on the basis of said third target width is adjusted after forming metal silicide regions in said drain and source regions of said specified type of transistor.

24. The method of claim 21, further comprising forming offset sidewall spacers on said specified type of transistor prior to forming said etch stop layer.

* * * * *